United States Patent
Chen et al.

(10) Patent No.: US 10,818,003 B2
(45) Date of Patent: Oct. 27, 2020

(54) HIGH-PRECISION INTELLIGENT DETECTION METHOD FOR BRIDGE DISEASES BASED ON SPATIAL POSITION

(71) Applicant: Chongqing Construction Engineering Group Corporation Limited, Chongqing (CN)

(72) Inventors: Bo Chen, Chongqing (CN); Yifei Wu, Chongqing (CN); Guoqiang Liu, Chongqing (CN); Xiaoni Zeng, Chongqing (CN); Xiaojun Deng, Chongqing (CN); Zongyong Chen, Chongqing (CN); Lin Qiu, Chongqing (CN)

(73) Assignee: Chongqing Construction Engineering Group Corporation Limited (CN)

( * ) Notice: Subject to any disclaimer, the term of this patent is extended or adjusted under 35 U.S.C. 154(b) by 27 days.

(21) Appl. No.: 16/156,528

(22) Filed: Oct. 10, 2018

(65) Prior Publication Data

US 2020/0098103 A1    Mar. 26, 2020

(30) Foreign Application Priority Data

Sep. 21, 2018    (CN) .......................... 2018 1 1107843

(51) Int. Cl.
| | | |
|---|---|---|
| *G06K 9/00* | (2006.01) | |
| *G06T 7/00* | (2017.01) | |
| *G06F 30/13* | (2020.01) | |
| *G06N 3/08* | (2006.01) | |
| *G06N 5/04* | (2006.01) | |

(52) U.S. Cl.
CPC ............ *G06T 7/0006* (2013.01); *G06F 30/13* (2020.01); *G06N 3/08* (2013.01); *G06N 5/046* (2013.01); *G06T 2207/30132* (2013.01); *G06T 2207/30184* (2013.01)

(58) Field of Classification Search
CPC ......... G06T 7/0006; G06T 2207/30132; G06T 2207/30184; G06F 30/13; G06N 5/046; G06N 3/08
See application file for complete search history.

(56) References Cited

U.S. PATENT DOCUMENTS

2018/0308230 A1* 10/2018 Karube .................. G01N 21/88
2019/0178814 A1*  6/2019 Nakano ................ G01B 11/026

* cited by examiner

*Primary Examiner* — Dhaval V Patel
(74) *Attorney, Agent, or Firm* — Lerner, David, Littenberg, Krumholz & Mentlik, LLP

(57) ABSTRACT

A high-precision intelligent detection method for bridge diseases based on spatial position. The method comprising: collecting images based on the high-definition image acquisition system; importing the image data and position information data into image processing software to create a mosaic image of each part of the bridge; importing the prepared spliced image map into the bridge disease intelligent identification system; obtaining the corresponding position and bridge of the bridge disease in the three-dimensional model of the bridge; identifying the stitched image map to obtain the size of the disease after identifying the bridge disease image and locating the bridge disease. The high-precision intelligent detection method for bridge diseases based on spatial position realizes automatic collection and intelligent analysis of bridge inspection data, reduces the workload of the inspection technicians and improves the detection efficiency.

9 Claims, 3 Drawing Sheets

HIGH-PRECISION INTELLIGENT DETECTION METHOD FOR BRIDGE DISEASES BASED ON SPATIAL POSITION

CROSS REFERENCE TO RELATED APPLICATIONS

The present application claims priority from Chinese Patent Application No. 201811107843.6, filed Sep. 21, 2018, the disclosure of which is hereby incorporated herein by reference.

BACKGROUND

Technical Field

The disclosure relates to bridge disease detection, and particularly to high-precision intelligent detection method for bridge diseases based on spatial position.

Description of Related Art

The inspection of bridges is divided into regular inspections, periodic inspections and special inspections. The period of frequent inspection depends on the technical condition of the bridge. Generally, it should not be less than one time per month. The irregular inspection should be strengthened during the flood season. Urban bridge maintenance grades are divided into three grades, and urban bridges of all grades must be inspected frequently.

The period of frequent inspection is as follows: the maintenance inspection of I urban bridges, such as urban trunk roads, bridges on urban expressways, bridges with extra large bridges and special structures, which is one day; the maintenance of II of urban bridges, such as the regional assembly points in urban bridges, the contact lines between commercial areas and tourist routes or urban areas, and the frequent inspection period of bridges in major areas or key enterprises, which are three days; the regular inspection period of the bridges of the city bridges, such as the urban branch roads and the bridges on the street roads, which is seven days. Every bridge needs to be inspected regularly according to the requirements. The workload of the bridge maintenance management unit is very large.

The current bridge inspections mainly have the following deficiencies: the expressway has the characteristics of large traffic flow and inconvenient closed construction. The traffic safety hazard in the detection process has always been the biggest safety hazard in the inspection process. Compared with the full sealing operation, the inspection operation under the open traffic condition is more dangerous; for special structural bridges (such as cable-stayed bridges, suspension bridges, concrete-filled steel tube arch bridges, etc.) or large-span high-rise bridges, traditional inspection tools can hardly come in handy and can only return to the original form of manual detection; it is necessary for experienced inspectors to use relevant proprietary instruments to identify bridge diseases. The whole process has high intensity and long period. The detection process is highly dependent on the inspectors, so human error detection cannot be avoided.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

The word "module" as used hereinafter, refers to logic embodied in hardware or firmware, or to a collection of software instructions, written in a programming language, such as, for example, JAVA, C, or assembly. One or more software instructions in the modules may be embedded in firmware such as in an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
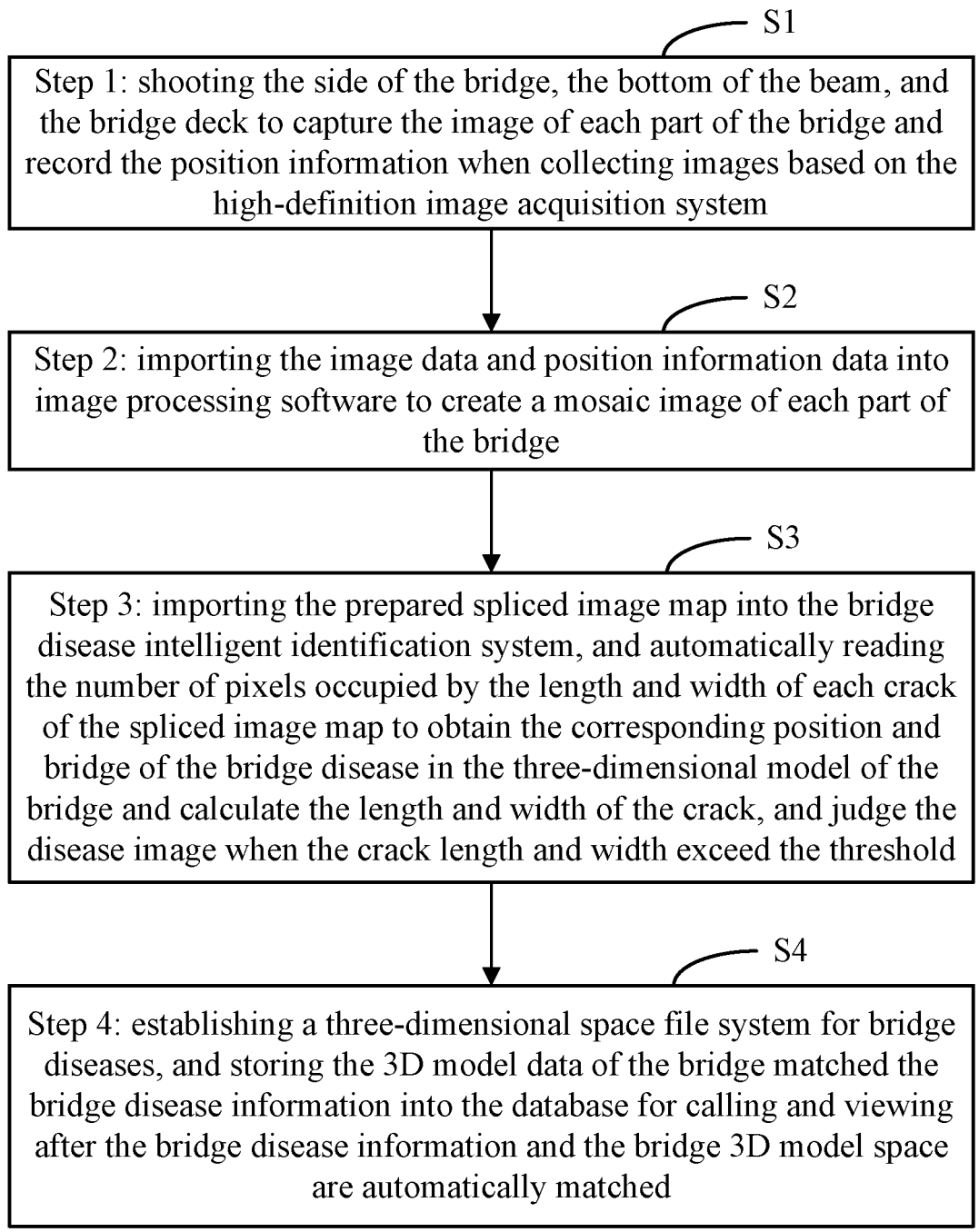
FIG. 1 is a general flowchart of one embodiment of a high-precision intelligent detection method for bridge diseases based on spatial position as disclosed.

FIG. 1 is a general flowchart of one embodiment of a high-precision intelligent detection method for bridge diseases based on spatial position as disclosed. In one embodiment, the high-precision intelligent detection method comprise the next steps.

In S1, step 1: shooting the side of the bridge, the bottom of the beam, and the bridge deck to capture the image of each part of the bridge and record the position information when collecting images based on the high-definition image acquisition system.

In S2, step 2: importing the image data and position information data into image processing software to create a mosaic image of each part of the bridge.

In S3, step 3: importing the prepared spliced image map into the bridge disease intelligent identification system, and automatically reading the number of pixels occupied by the length and width of each crack of the spliced image map to obtain the corresponding position and bridge of the bridge disease in the three-dimensional model of the bridge and calculate the length and width of the crack, and judge the disease image when the crack length and width exceed the threshold.

In S4, step 4: establishing a three-dimensional space file system for bridge diseases, and storing the 3D model data of the bridge matched the bridge disease information into the database for calling and viewing after the bridge disease information and the bridge 3D model space are automatically matched.

Figure 2:
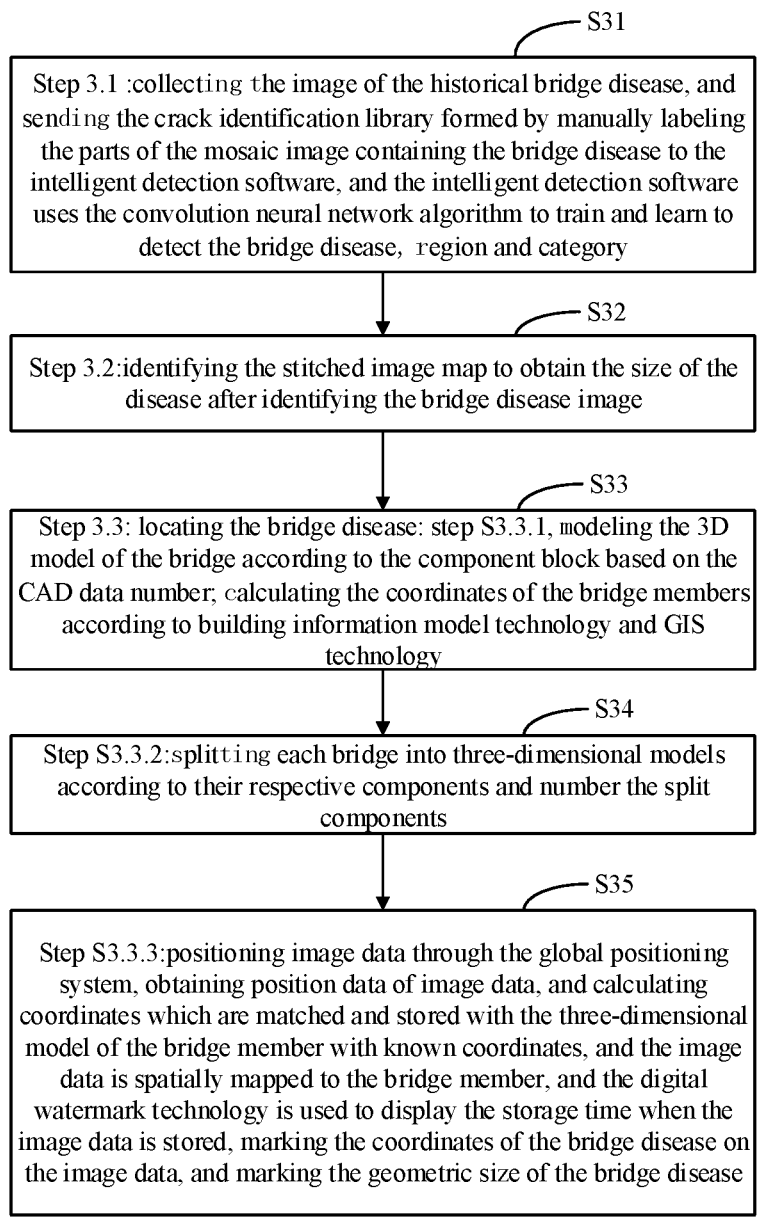
FIG. 2 is a specific flowchart of one embodiment of step 3 in FIG. 1.

FIG. 2 is a specific flowchart of one embodiment of step 3 in FIG. 1. In one embodiment, step 3 in FIG. 1 comprise the next steps.

In S31, step 3.1: collecting the image of the historical bridge disease, and sending the crack identification library formed by manually labeling the parts of the mosaic image containing the bridge disease to the intelligent detection software, and the intelligent detection software uses the convolution neural network algorithm to train and learn to detect the bridge disease, region and category. Gaussian blur, sobel operator, morphological opening and closing algorithm can also be used to preprocess the stitched image map, and then use the support vector machine algorithm to train the intelligent detection software.

In S32, step 3.2: identifying the stitched image map to obtain the size of the disease after identifying the bridge disease image. The formula is as follows: Resolution=Dm/Dp, where Dp is the target size on the stitched image, Dm is the target size, Resolution is the resolution of the stitched image, the actual length of the bridge is Lm=Lp*Resolution, and Lp is the bridge disease. Length on the stitched image.

In S33, step 3.3: locating the bridge disease comprise the next steps.

In step S3.3.1, modeling the 3D model of the bridge according to the component block based on the CAD data number; calculating the coordinates of the bridge members according to building information model technology and GIS technology.

Specifically, Building Information Modeling (BIM) is based on the relevant information data of the construction project, and the building model is built. The real information of the building is simulated by digital information simulation. It has eight characteristics of information completeness, information relevance, information consistency, visualization, coordination, simulation, optimization and graphics.

Specifically, geographic Information System (GIS) is a specific and important spatial information system. It is a technical system for collecting, storing, managing, computing, analyzing, displaying and describing geographically distributed data in all or part of the Earth's surface (including the atmosphere) with the support of computer hardware and software systems.

In S34, in step S3.3.2, splitting each bridge into three-dimensional models according to their respective components and number the split components.

In S35, in step S3.3.3, positioning image data through the global positioning system, obtaining position data of image data, and calculating coordinates which are matched and stored with the three-dimensional model of the bridge member with known coordinates, and the image data is spatially mapped to the bridge member, and the digital watermark technology is used to display the storage time when the image data is stored, marking the coordinates of the bridge disease on the image data, and marking the geometric size of the bridge disease.

The staff registered the condition evaluation results of each component of the bridge in the "bridge case card" through the three-dimensional space file system of the bridge disease. According to the "bridge case card" and the inspection bridge list, the three-dimensional space file system of the bridge disease automatically generates the statistical results of the inspection results. Visualization chart and trend changes and analysis visualization chart compared to the results of the last inspection.

Figure 3:
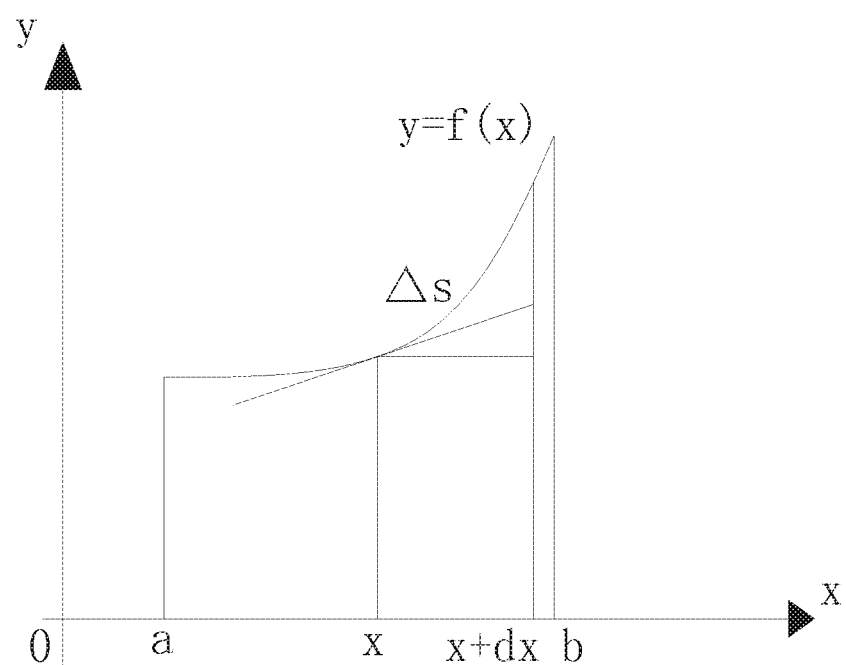
FIG. 3 is a graph of the calculation method of the plane curve of one embodiment of step 3.2 in FIG. 2.

Referring to FIG. 3, FIG. 3 is a graph of the calculation method of the plane curve of one embodiment of step 3.2 in FIG. 2. In this embodiment, the length of the target size Dp on the stitched image in step 3.2 is calculated by using the arc length S of the plane curve, and the formula is as follows.

Define the Cartesian coordinates, and let the function $f(x)$ have a first-order continuous derivative on the interval [a, b], and the length S of the curve y=$f(x)$ is the length of the crack.

If X is set as the integral variable and x∈[a, b] take an inter-cell [x,x+dx] on [a,b], then the length ΔS of the curve arc corresponding to this cell can be approximated by its arc differential ds, then the arc length element is ds=$\sqrt{1+[f'(x)]^2}$dx, P and the length of the arc is the length of the crack $$s = \int_a^b \sqrt{1 + [f'(x)]^2}\, dx.$$

The formula for calculating the width W of the target size Dp on the stitched image in step 3.2 is as follows: W=μ*N, where W is the crack width, μ is the pixel size of the high-definition image acquisition system, and N is the number of crack-occupying pixels.

Specifically, In the present embodiment, the unmanned aerial vehicle in the equipment detects the appearance of the bridge lower structure, the beam bottom, and the bridge deck. Check the cracks (cracks, vertical and horizontal cracks) of the pavement layer of the bridge, pits, waves, bridge head settlement, abnormal deformation, breakage, and shedding of the expansion joint; whether the end of the beam or the bottom surface is damaged, whether the beam has expansion space, and the concrete has No cracks, water seepage, surface weathering, spalling, exposed ribs, pre-stressed steel bundle anchorage section concrete cracking, longitudinal cracks along the concrete surface of the pre-stressed tendons; beam (plate) structure of the mid-span, fulcrum and Variable section, cantilever end of the ox leg or intermediate hinge, beam consolidation and truss joints, whether the concrete is cracked, defective and exposed; the defect of the assembled beam bridge joint: the deck and beam of the composite beam Whether the concrete at the joint between the joint part and the prefabricated bridge deck is cracked or seepage; whether the transverse joint structure is cracked, whether the welded joint of the steel plate is corroded or broken, whether the side beam is traversed or inclined outward; Component cracking, misalignment, voiding, displacement, etc.

In this embodiment, the high-definition image capturing system is composed of a drone or an in-vehicle system or a combination of any one or more of the bridge inspection working platforms. The high-definition image capturing system of the embodiment adopts a drone to the side of the bridge, the bottom of the beam, The bridge deck is used for image acquisition. Before the UAV is loaded with the HD image acquisition system, the UAV flight line is designed according to the tested bridge structure data to ensure that the UAV's shooting height and moving speed remain unchanged.

In this embodiment, a GPS base station is erected on the airspace on both sides of the bridge, and the GPS satellite signal is transmitted to the bottom of the bridge to improve the flight stability of the drone.

In this embodiment, the three-dimensional space file system of the bridge disease includes the number of the three-dimensional model component of the bridge, the picture, location, scope, development trend, conclusion and suggestion of the bridge disease.

The working principle of the disclosure: by manipulating the equipment equipped with the high-definition image acquisition system, the image data of each part of the bridge is collected, and the image data is recorded into the bridge disease intelligent identification system and the bridge disease three-dimensional space file system to realize the visual management of the bridge disease, and multiple data. Automatic comparison can be achieved to predict future disease development trends.

The beneficial effects of the disclosure comprises the follows.

This method realizes automatic collection and intelligent analysis of bridge inspection data, and reduces the workload of inspection technicians to improve the detection efficiency.

Through the data acquisition of high-definition image acquisition system to realize the dynamic traceability of bridge diseases, the full coverage of bridge state data acquisition is implemented, and the dynamic quantitative evaluation of bridge disease development trends in different periods is realized.

Through the establishment of the bridge medical record, the quantitative dynamic management and accurate evaluation of the development, treatment, monitoring and evaluation of bridge diseases can be realized in the whole life of the bridge.

The foregoing disclosure of the various embodiments has been presented for purposes of illustration and description. It is not intended to be exhaustive or to limit the present disclosure to the precise forms disclosed. Many variations and modifications of the embodiments described herein will be apparent to one of ordinary skill in the art in the light of the above disclosure. The scope of the present disclosure is to be defined only by the claims appended hereto and their equivalents.

What is claimed is:

1. A high-precision intelligent detection method for bridge diseases based on spatial position comprising:
   shooting the side of the bridge, the bottom of the beam, and the bridge deck to capture the image of each part of the bridge and record the position information when collecting images based on a high-definition image acquisition system;
   importing the image data and position information data into image processing software to create a mosaic image of each part of the bridge;
   importing a prepared spliced image map into a bridge disease intelligent identification system;
   automatically reading a number of pixels occupied by a length and width of each crack of the prepared spliced image map to obtain a corresponding position and bridge of a bridge disease in a three-dimensional model of the bridge and calculate the length and width of the crack, and judge a disease image when the crack length and width exceed the threshold;
   establishing a three-dimensional space file system for bridge diseases, and storing the 3D model data of the bridge matched the bridge disease information into a database for calling and viewing after the bridge disease information and the bridge 3D model space are automatically matched.

2. The high-precision intelligent detection method for bridge diseases based on spatial position of claim 1, wherein automatically reading the number of pixels occupied by the length and width of each crack of the prepared spliced image map to obtain the corresponding position and bridge of the bridge disease in the three-dimensional model of the bridge and calculate the length and width of the crack, and judge the disease image when the crack length and width exceed the threshold comprising:
   collecting the image of the historical bridge disease, and sending the crack identification library formed by manually labeling the parts of the mosaic image containing the bridge disease to the intelligent detection software, and the intelligent detection software uses the convolution neural network algorithm to train and learn to detect the bridge disease, region and category;
   identifying a stitched image map to obtain the size of the disease after identifying the bridge disease image, and the formula is as follows: Resolution=Dm/Dp, where Dp is the target size on the stitched image map, Dm is the target actual size, and Resolution is the stitched image; wherein, resolution of the graph, the actual length of the bridge disease Lm=Lp*Resolution, Lp is the length of the bridge disease on the stitched image; and
   locating the bridge disease.

3. The high-precision intelligent detection method for bridge diseases based on spatial position of claim 2, wherein locating the bridge disease comprising:
   modeling the 3D model of the bridge according to the component block based on a Computer Aided Design data number;
   calculating the coordinates of the bridge members according to building information model technology and Geographic Information System technology;
   splitting each bridge into three-dimensional models according to their respective components and number the split components;
positioning image data through the global positioning system, obtaining position data of image data, and calculating coordinates which are matched and stored with the three-dimensional model of the bridge member with known coordinates, and the image data is spatially mapped to the bridge member, and the digital watermark technology is used to display a storage time when the image data is stored, marking the coordinates of the bridge disease on the image data, and marking the geometric size of the bridge disease.

4. The high-precision intelligent detection method for bridge diseases based on spatial position of claim 2, wherein the length of the target size on the stitched image map Dp is calculated by the arc length S of the plane curve, and the formula is as follows: defining the Cartesian coordinates, let the function $f(x)$ have a first-order continuous derivative on the interval [a, b], and the length S of the curve y=$f(x)$ is the crack length, then the crack length is $$s = \int_a^b \sqrt{1 + [f'(x)]^2}\, dx$$

according to the calculus principle, wherein width W of the target size on the stitched image map Dp is calculated as follows: W=$\mu$*N, where W is the crack width, $\mu$ is the pixel size of the high-definition image acquisition system, and N is the number of crack-occupying pixels.

5. The high-precision intelligent detection method for bridge diseases based on spatial position of claim 2, wherein the high-definition image capturing system is composed of one or more combinations of a drone or an in-vehicle system or a bridge inspection working platform.

6. The high-precision intelligent detection method for bridge diseases based on spatial position of claim 5, wherein the high-definition image capturing system adopts a drone to perform image collection on the side, beam bottom and bridge deck of the bridge.

7. The high-precision intelligent detection method for bridge diseases based on spatial position of claim 6, wherein before an Unmanned Aerial Vehicle is loaded with the high-definition image acquisition system, the Unmanned Aerial Vehicle flight line is designed according to the tested bridge structure data to ensure a shooting height of the Unmanned Aerial Vehicle and moving speed remain unchanged.

8. The high-precision intelligent detection method for bridge diseases based on spatial position of claim 7, wherein set up a Global Positioning System base station on the airspace on both sides of the bridge to transmit Global Positioning System satellite signals to the bottom of the bridge to improve the stability of the flight signal of the drone.

9. The high-precision intelligent detection method for bridge diseases based on spatial position of claim 2, wherein the three-dimensional space file system of the bridge disease includes the number of the three-dimensional model of the bridge, the picture, location, scope, development trend, conclusion and suggestion of the bridge disease.

\* \* \* \* \*